(12) United States Patent
Hedberg (10) Patent No.: US 6,201,405 B1
(45) Date of Patent: Mar. 13, 2001

(54) OUTPUT BUFFER CIRCUIT (75) Inventor: Mats Hedberg, Haninge (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/307,785

(22) Filed: May 10, 1999

Related U.S. Application Data (63) Continuation of application No. PCT/EP97/06280, filed on Nov. 11, 1997.

(30) Foreign Application Priority Data

Nov. 12, 1996 (DE) ............................................. 196 46 684

(51) Int. Cl.$^7$ .............................................. H03K 17/16
(52) U.S. Cl. ............................................. 326/30; 326/86
(58) Field of Search ................... 326/30, 86, 31

(56) References Cited

U.S. PATENT DOCUMENTS

| 5,296,756 | 3/1994 | Patel et al. . |
| 5,559,441 | 9/1996 | Desroches . |
| 5,808,478 | * 9/1998 | Andresen ............................ 326/31 |
| 5,811,984 | * 9/1998 | Long et al. ......................... 326/30 |
| 5,977,796 | * 11/1999 | Gabara ............................... 326/86 |

FOREIGN PATENT DOCUMENTS

| 0 463 316 A1 | 1/1992 | (EP) . |
| 0 482 392 A2 | 4/1992 | (EP) . |
| 95/02931 | 1/1995 | (WO) . |

OTHER PUBLICATIONS

Knight, Jr., "A Self–Terminating Low–Voltage Swing CMOS Output Driver", IEEE Journal of Solid–State Circuits, vol. 23, No. 2, Apr. 1988, pp. 457–464.

* cited by examiner

*Primary Examiner*—David Nelms
*Assistant Examiner*—Thong Le
(74) *Attorney, Agent, or Firm*—Nixon & Vanderhye (57) ABSTRACT

An output buffer circuit for driving a transmission line (7) in accordance with data to be transmitted, comprises a switch stage (1) having an input port (1H, 1L), an output port (OP, ON, OUT) for connection to said transmission line (7) and a control terminal (4). The switch stage comprises switches adapted for connecting the output port with the input port in accordance with a digital input signal (IN). Impedance means (15, 16) are connected to said switch stage (1) and have an impedance control input (C1, C2) for adjusting their impedance in accordance with a control signal. Means are provided for controlling the output impedance of the output port by means of adjusting the impedance of the impedance means (15, 16). A selector circuit (2) selectively connects the output port with a detection input of said controlling means (3), said selector circuit (2) being connected to receive a selection control signal having a fixed timing relationship with said digital input signal.

19 Claims, 4 Drawing Sheets

OUTPUT BUFFER CIRCUIT

This application is a Continuation of PCT/EP97/06280 filed Nov. 11, 1997.

The present invention relates to an output buffer circuit for driving a transmission line in accordance with data to be transmitted, the output buffer circuit being able to adjust the output impedance to match the characteristic impedance of the transmission line.

With the ever increasing operating speed of digital circuitry, also the demands on interfaces linking different circuit components regarding data transmission capacity will increase. The higher the bit rate to be transmitted via a transmission line, the more important is that both the transmitting side and the receiving side connected via a transmission line, have a source impedance and an input impedance, respectively, which match the characteristic impedance of the transmission line. Such impedance matching is inevitable for avoiding reflections on the transmission line which might otherwise disturb data transmission at high data rates.

U.S. Pat. No. 5,134,311 discloses a self-adjusting impedance matching driver circuit having an array of pull-up gates to VDD and an array of pull-down gates to ground. One or more of such gates is selectively enabled in response to circuit means that monitors the impedance match between the output of the driver circuit and the network it drives. For this purpose a comparator has an input connected to the output of the driver circuit and an output that controls latches for selectively enabling one or more of said pull-up gates and other latches for controlling one or more of said pull-down gates, such that closed loop output impedance control is performed.

IEEE International Solid State Circuits Conference 1993, Session 10, High Speed Communication and Interfaces, paper 10.7 discloses a circuit for performing automatic impedance matching between a CMOS output buffer circuit and an externally connected transmission line. According to that proposal, impulses are output by the driver circuit to the transmission line, and during a period of time prior to the arrival of possible reflections from the end of the transmission line, the output voltage of the buffer is controlled to half the supply voltage, implying that then the output impedance of the buffer equals the characteristic impedance of the line. Such control is performed independently for the pull-up gate of the CMOS driver and the pull-down gate of the CMOS driver, each of these gates comprising an array of drive transistors selectively enabled by an impedance control register.

Both these approaches of the prior art adopt some kind of control loop for adjusting the output impedance of a line driver circuit, the control loop including the detection of the actual output impedance and the adjustment of impedance means determining the actual output impedance of the driver, such that the detected output impedance matches a desired value.

However, according to these approaches it is not easily possible to detect the actual output impedance of the output buffer on a continuous basis when the buffer is transmitting data. For this reason the first mentioned approach of setting up the output buffer takes place at power up and thereafter only if the driven network is changed substantially. The second approach suffers from extreme timing demands due to the fact that output impedance detection has to take place before a possible reflection from the end of the transmission line has arrived at its beginning.

It is the object of the present invention, to provide an output buffer circuit having an output impedance self-adjustable to a desired impedance value even during the transmission of data.

According to the present invention, this object is solved as defined in claim 1. Advantageous embodiments are described in the dependent claims.

An output buffer circuit according to the present invention is able to perform a self adjustment of its output impedance by means of monitoring the output of an output stage to the transmission line. Monitoring is achieved by means of a selector circuit that selectively connects the output port of the output stage to a detection input of an output impedance control circuit in such a manner that the data signal changes at the output port do not adversely affect the detection of the actual output impedance. The timing of this selective connection depends on the data signal output by the output buffer.

In a simple and preferable embodiment the selector circuit operates as a rectifier synchronized with the data signal, for synchronously rectifying the output signal of the buffer circuit. It can comprise a bridge circuit controlled by the data input signal. According to another preferred embodiment the selector circuit is adapted to sample the output signal of the buffer in synchronism with the data signal to be transmitted. Means for holding the sampled signal may be provided if sampling takes place during a fraction of each bit period of the data signal only.

The detection signal output by the selector circuit and indicating the actual source impedance of the output buffer, is used by the impedance control circuit to adjust the output impedance of the buffer circuit in accordance with a reference value. In a simple and preferred embodiment the impedance control circuit comprises control amplifier means connected to receive at its differential inputs, the impedance detection signal and a reference signal, respectively. The output of the control amplifier adjusts or controls the output impedance of the buffer, thus constituting a control loop.

According to a preferred embodiment, the output buffer circuit comprises a series connection of output impedance means for adjusting the output impedance of the buffer, and a switch stage for connection with a transmission line. The switch stage is controlled in accordance with data to be transmitted. The output buffer circuit is designed such that an impedance connected to the output of the switch stage, e.g. a transmission line with termination, constitutes a voltage divider circuit with the output impedance means and with the switch stage connected there between.

If the switch elements included in the switch stage contribute to the overall output impedance, the provision of the selector circuit allows detecting an output voltage of this voltage divider across the output terminals of the buffer circuit substantially unaffected by the switching operation of the switch stage. On the basis of the known impedance connected to the output of the switch stage, the detected voltage indicates the overall impedance of the output buffer including the impedance of the adjustable output impedance means and the impedance of the switch stage. The control circuit can then preferably operate to achieve that the detected voltage across the output of the switch stage equals half the supply voltage of the series connection of output impedance means, switch stage and connected load impedance.

If a plurality of output buffer circuits for a plurality of data channels is provided on the same chip, i.e. on the same semiconductor substrate, use can be made of the fact that each of the individual buffer circuits of the chip can be made to have very similar electrical properties by means of manufacturing all circuits with the same process, as is well known as such. Then the provision of a single selector circuit and a single impedance control circuit may be sufficient for a plurality of buffer circuits each having a switch stage and an output impedance means each receiving the same impedance control signal.

The present invention is advantageous in that it uses the impedance connected to the output buffer, as a reference impedance. The output buffer can, therefor, automatically adapt its output impedance to different load impedances without the need of connecting or adjusting additional external reference impedances, this leading to pin count savings in LSI designs where the number of output pins more and more becomes a critical parameter.

In the following, preferred embodiments of the present invention will be described in detail with reference to the accompanying drawings.

Figure 1:
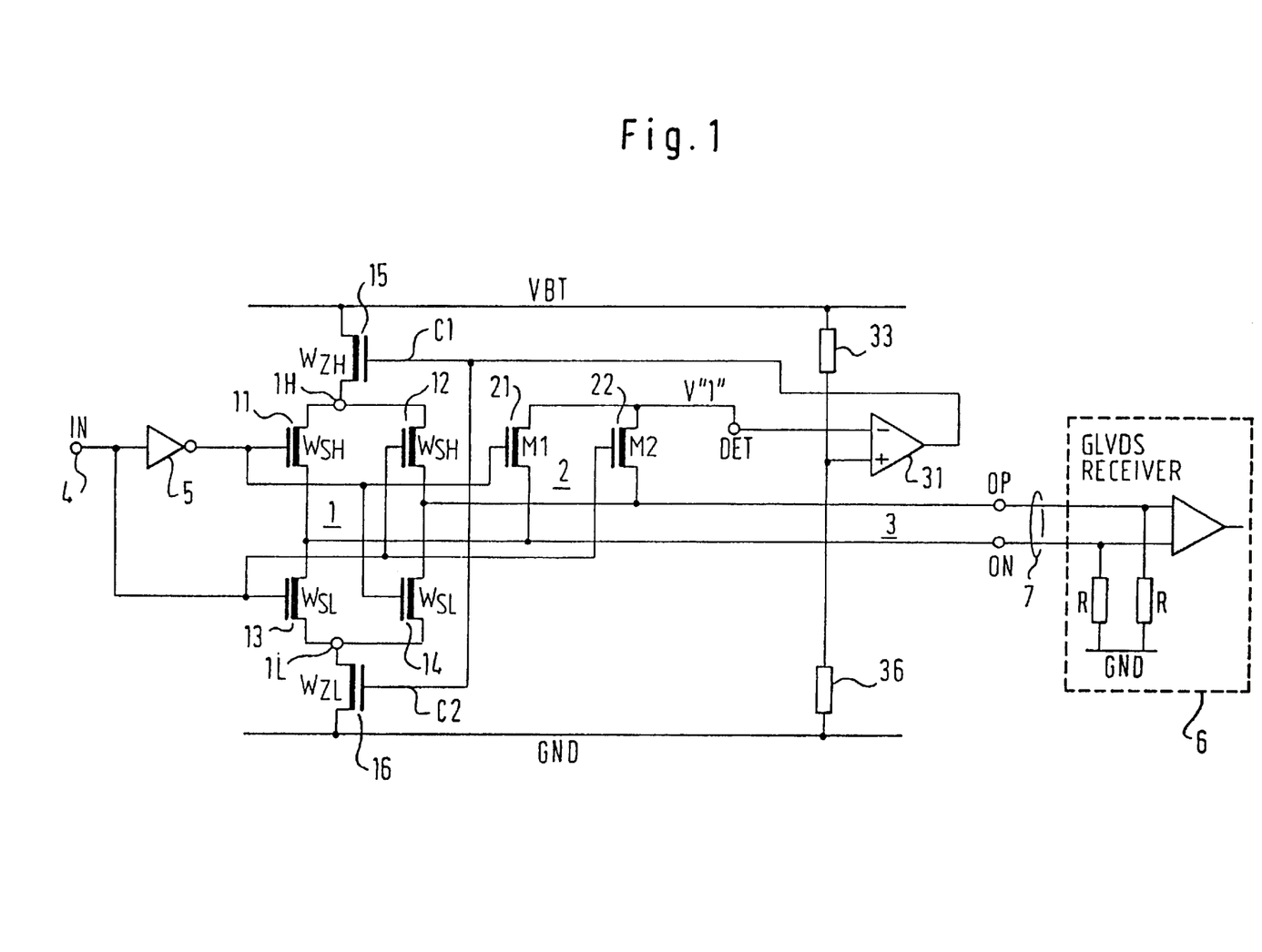
FIG. 1 shows a first embodiment of an output buffer circuit according to the present invention for driving a symmetrical transmission line, including single loop output impedance control.

FIG. 1 shows a first embodiment of an output buffer circuit according to the present invention, adapted to drive a symmetrical transmission line 7 terminated by a receiver 6. This embodiment comprises a switch stage 1 including four switching transistors 11 to 14 connected as a bridge. A first diagonal of this bridge, i.e. nodes 1H and 1L, constitute an input port of the switch stage while a second diagonal of the switch stage, i.e. nodes OP and ON, constitute an output port for connection to the transmission line 7.

Reference numeral 15 denotes a MOSFET transistor connected between node 1H of the input port of switch stage 1 and a power supply line VBT for supplying an upper power supply potential. Reference numeral 16 denotes a MOSFET transistor connected between the other node 1L of the input port of switch stage 1, and a lower supply line GND for supplying a lower power supply potential. MOSFET transistors 15 and 16 respectively constitute controllable impedance means an impedance of which depends on a control signal C1 applied to the gate of transistor 15 and control signal C2 applied to the gate of transistor 16, respectively. In this embodiment, the channel width $W_{ZH}$ of the upper transistor 15 is larger than the channel width $W_{ZL}$ of the lower transistor 16 in order to achieve that if the gates of transistors 15 and 16 receive the same control signal, the impedance of the drain source path of transistor 15 approximately equals the impedance of the drain source path of transistor 16.

Reference numeral 5 denotes an inverter circuit receiving at its input 4 a data signal IN for transmission over the transmission line. The data signal IN is applied to the gates of a first diagonal constituted by transistors 12 and 13 of the switch stage 1 while the complementary input signal output by inverter 5, is applied to the gates of a second diagonal constituted by transistors 11, 14 of the switch stage 1. This circuit configuration results in the output voltage across the terminals OP and ON of the output port of the switch stage 1 changing its polarity in accordance with the data signal IN at data input terminal 4.

The switch stage 1 is designed such that the upper transistors 11 and 12 of the switch stage 1 have the same channel width $W_{SH}$ while the lower transistors 13 and 14 of the switch stage 1 have the same channel width $W_{SL}$. The output impedance of the output port OP, ON is thus determined by the series connection of the upper adjustable impedance element 15, the ON impedance of that particular transistor 11 or 12 which is currently conducting, the ON impedance of that particular transistor 13, 14 which is currently conducting, and the lower adjustable impedance means 16. This impedance is substantially independent of the switching state of the switch stage 1 and, accordingly, independent of the logical level of the data input signal IN. As a consequence, the voltage of the output terminals OP, ON has an amplitude determined by the supply voltage and the voltage divider constituted by said series connection of the impedances of elements 11 to 16 and the impedance connected across output terminals OP, ON. The polarity of this voltage depends on the data signal IN.

In order to achieve a detection of the output port impedance, the amplitude of the voltage across the output terminals OP, ON is detected. In order to achieve this detection substantially unaffected from the polarity changes due to an ongoing data transmission, this embodiment includes a first switching MOSFET 21 having its drain source path connected with output terminal ON, and a second switching MOSFET 22 having its drain source path connected with output terminal OP of the output port. These transistors 21 and 22 constitute a selector circuit 2. Transistor 22 receives at its gate the data input signal IN while transistor 21 receives at its gate the complementary data input signal output by inverter 5.

The drain source paths of transistors 21 and 22 are connected with the output terminals OP, ON and an impedance detection input DET of an impedance control circuit 3 such that in synchronism with the data input signal IN, one of the output terminals, which has the more positive potential, is connected with the impedance detection input DET.

The impedance control circuit 3 comprises a control amplifier 31 having an inverting input acting as the impedance detection input DET connected with the selector circuit 2. A non-inverting input of control amplifier 31 receives a reference voltage obtained from a voltage divider constituted by a series connection of resistors 33 and 36 across the power supply lines VBT and GND. The output of control amplifier 31 provides the control signal C1 to the gate of the upper adjustable impedance 15 and to the gate of the lower adjustable impedance 16.

Because of the synchronous selection of the output terminals OP, ON for connection with the impedance detection input DET, performed by selector circuit 2 in synchronism with the data input signal IN, the inverting input of control amplifier 31 receives a voltage substantially unaffected by the polarity changes across the output terminals OP, ON. Control amplifier 31 will adjust the upper impedance means 15 such that the voltage at its non-invserting input, generated by resistors 33 and 36 connected as a voltage divider, substantially equals the voltage at that one of terminals OP, ON which is currently connected to the upper input port node 1H. If each of the conductors of transmission line 7 is terminated to ground GND, as shown in the figure, the impedance of the lower impedance element 16 approximately follows the impedance of the upper impedance element 15 but is not a part of the impedance control loop.

In order to have the impedance of the lower MOSFET 16 closely follow the impedance of the upper MOSFET 15, the channel geometries of transistors 15 and 16 are preferably such that the ratio channel width to channel length of the upper transistor 15 is larger than the ratio channel width to channel length of the lower transistor 16, in order to take account of the different source potentials of these transistors.

If on the other hand, transmission line 7 is terminated in a floating manner, the ratio of resistor 33 to resistor 36 equals the ratio of the series impedance of elements 15 and the conducting one of elements 11, 12 to the series impedance of the load impedance across output terminals OP, ON, the conducting one of elements 13, 14 and the lower impedance means 16. Accordingly, by appropriately selecting resistors 33 and 36 it is possible to achieve that the output port impedance assumes a predefined relation to the connected load impedance. If the channel geometries of transistors 15 and 16 are selected such that these transistors have an approximately equal impedance, and if the channel geometries of switching transistors 11 to 14 are selected such that the ON impedance of the upper transistors 11, 12 substantially equals the ON impedance of the lower transistors 13, 14, the output impedance of the output port OP, ON will approximately equal the load impedance connected across OP, ON, if resistor 36 has three times the resistance of resistor 33.

This embodiment is advantageous in that the number of components for output impedance control of the output port OP, ON is comparatively low. It is particularly suitable for applications where the supply voltage across supply lines VBT and GND is low, e.g. in the order of 1 Volt.

Figure 2:
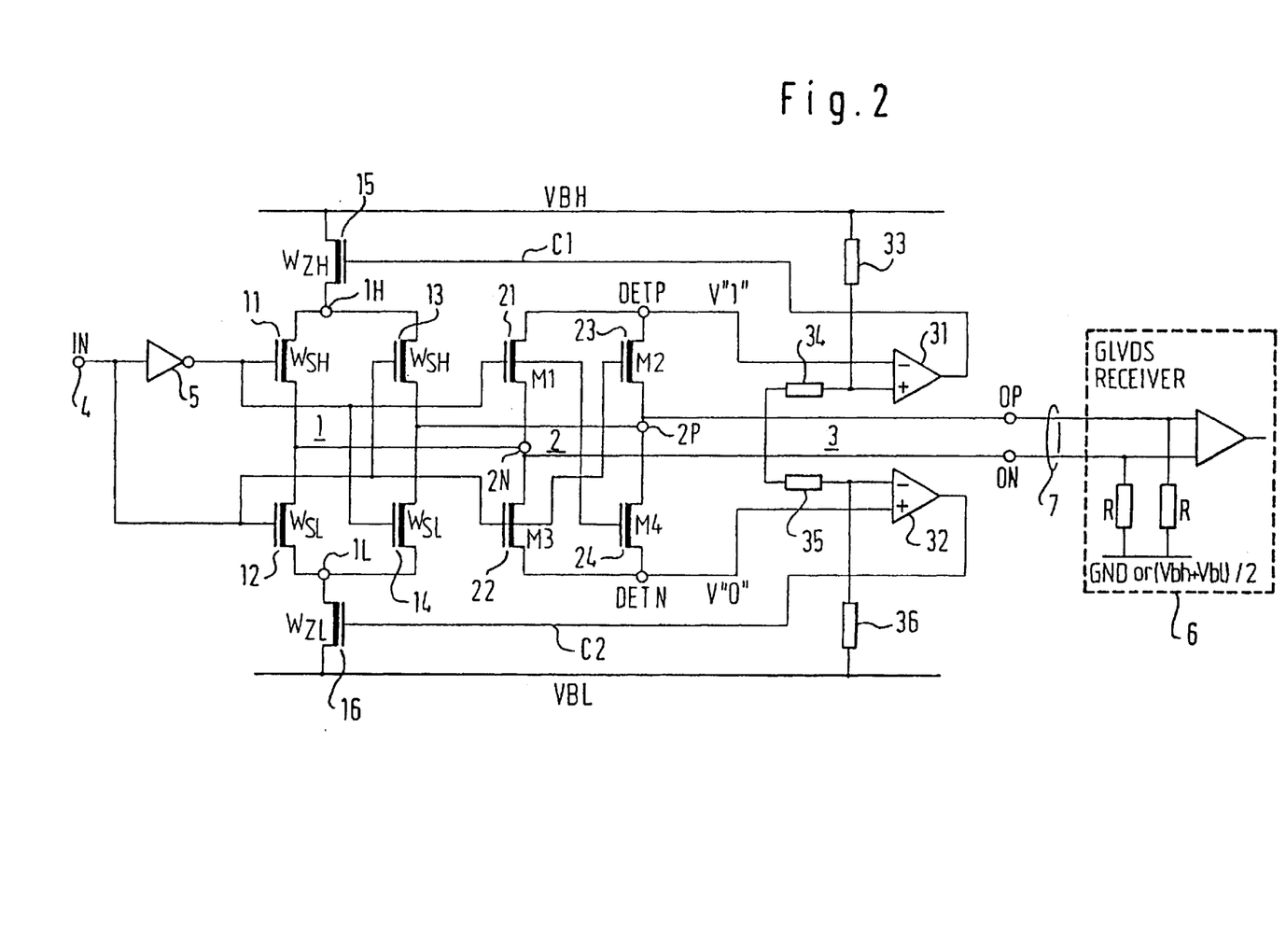
FIG. 2 shows a second embodiment for driving a symmetrical transmission line including dual loop output impedance control.

FIG. 2 shows a second embodiment of an output buffer circuit according to the present invention, this circuit being designed to drive a symmetrical transmission line 7 and including a separate control loop for each of an upper adjustable impedance element 15 and a lower adjustable impedance element 16.

Similar to FIG. 1, FIG. 2 shows a switch stage 1 including MOSFET transistors 11 to 14 and upper and lower MOSFET transistors 15 and 16 acting as upper and lower impedance elements, respectively, connected to switch stage 1. Moreover, similar to the previous embodiment, the circuit comprises an inverter circuit 5 receiving a data input signal IN at an input terminal 4. Regarding the details of interconnection and operation of elements 1, 4, 5 and 11 to 16 of FIG. 2, reference is made to the description of these elements given for FIG. 1.

Due to the dual loop structure of the embodiment shown in FIG. 2, the upper impedance element 15 and the lower impedance element 16 receive separate control signals C1, C2. The channel width $W_{ZH}$ of the upper element 15 can be but need not be larger than the channel width $W_{ZL}$ of the lower impedance element 16.

Reference numeral 2 denotes a selector circuit comprising four MOSFET transistors 21 to 24 connected as a bridge. A first diagonal of transistors 21, 24 receives the same control signal at their gates as the corresponding diagonal of transistors 11, 14 of the switch stage 1. Similarly, a second diagonal comprising transistors 22, 23 of the selector circuit 2 receives at their gates the same control signal as the corresponding second diagonal comprising transistors 12, 13 of the switch stage 1.

In this embodiment, the selector circuit 2 constitutes a synchronous bridge rectifier connected to rectify the output signal across the output terminals OP, ON of the switch stage 1 in synchronism with the data signal controlling the switching of the switch stage 1. For this purpose, a first diagonal constituted by nodes 2N, 2P of the selector bridge circuit 2 is connected with output terminal OP and ON, respectively, of the switch stage 1. A second diagonal constituted by nodes DETP and DETN of the selector bridge circuit 2 outputs impedance detection signals to an impedance control circuit 3.

The impedance control circuit 3 comprises an upper control amplifier 31 receiving at its inverting input the impedance detection signal output by node DETP of selector circuit 2, and furthermore comprises a lower control amplifier 32 receiving at its noninverting input the impedance detection signal output by node DETN of selector circuit 2. The impedance control circuit 3 furthermore comprises a series connection of reference resistors 33, 34, 35 and 36 connected across the same power supply lines VBH, VBL which supply power to the series connection of the upper impedance means 15, the switch stage 1 and the lower impedance means 16. The noninverting input of upper control amplifier 31 is connected with a node between resistors 33 and 34. The inverting input of the lower control amplifier 32 is connected with a node between the resistors 35 and 36. In FIG. 2, each of resistors 33 to 36 has the same resistance R. Of course, the series connection of resistors 34 and 36 can be replaced by a single resistor with the resistance 2R.

Reference numeral 6 in FIG. 2 denotes a receiver terminating the transmission line 7. The transmission line 7 connected to output terminals OP, ON of the output buffer circuit and terminated by receiver 6 acts as a load impedance across output terminals OP, ON.

In operation, the rectification of the output voltage across terminals OP, ON in synchronism with the switching operation of switch stage 1, results in a voltage appearing across nodes DETP, DETN which corresponds to the amplitude of the output voltage across output terminals OP, ON but substantially unaffected by the polarity changes of the buffer output voltage due to an ongoing data transmission. The voltage across nodes DETP, DETN depends on the connected load impedance across OP, ON, on an upper series impedance constituted by the upper impedance elements 15 and the conducting one of switching elements 11, 13, and on a lower series impedance constituted by the lower impedance 16 and the conducting one of switching transistors 12, 14.

Control amplifier 31 operates to adjust the impedance of element 15 by means of outputting a control signal C1 to its gate. Similarly, control amplifier 32 adjusts the impedance of transistor 16 by means of outputting a control signal C2 to its gate. Amplifiers 31 and 32 perform a control operation such that the voltage across resistor 33 substantially equals the voltage across the series connection of impedance element 15 and the conducting one of switching transistors 11 and 13, and furthermore, such that the voltage across resistor 36 substantially equals the voltage across the series connection of impedance elements 16 with the conducting one of switching transistors 12 and 14. As a consequence, the ratio of the load impedance to each of said upper and lower series impedances equals the ratio of the series resistance of resistors 34 and 35 to the impedance of resistor 33 and 36, respectively. If resistors 33 to 36 are dimensioned such that each has a resistance R, than the output impedance at output port OP, ON adjusts itself to be equal to the load impedance connected across the output port OP, ON.

Figure 3:
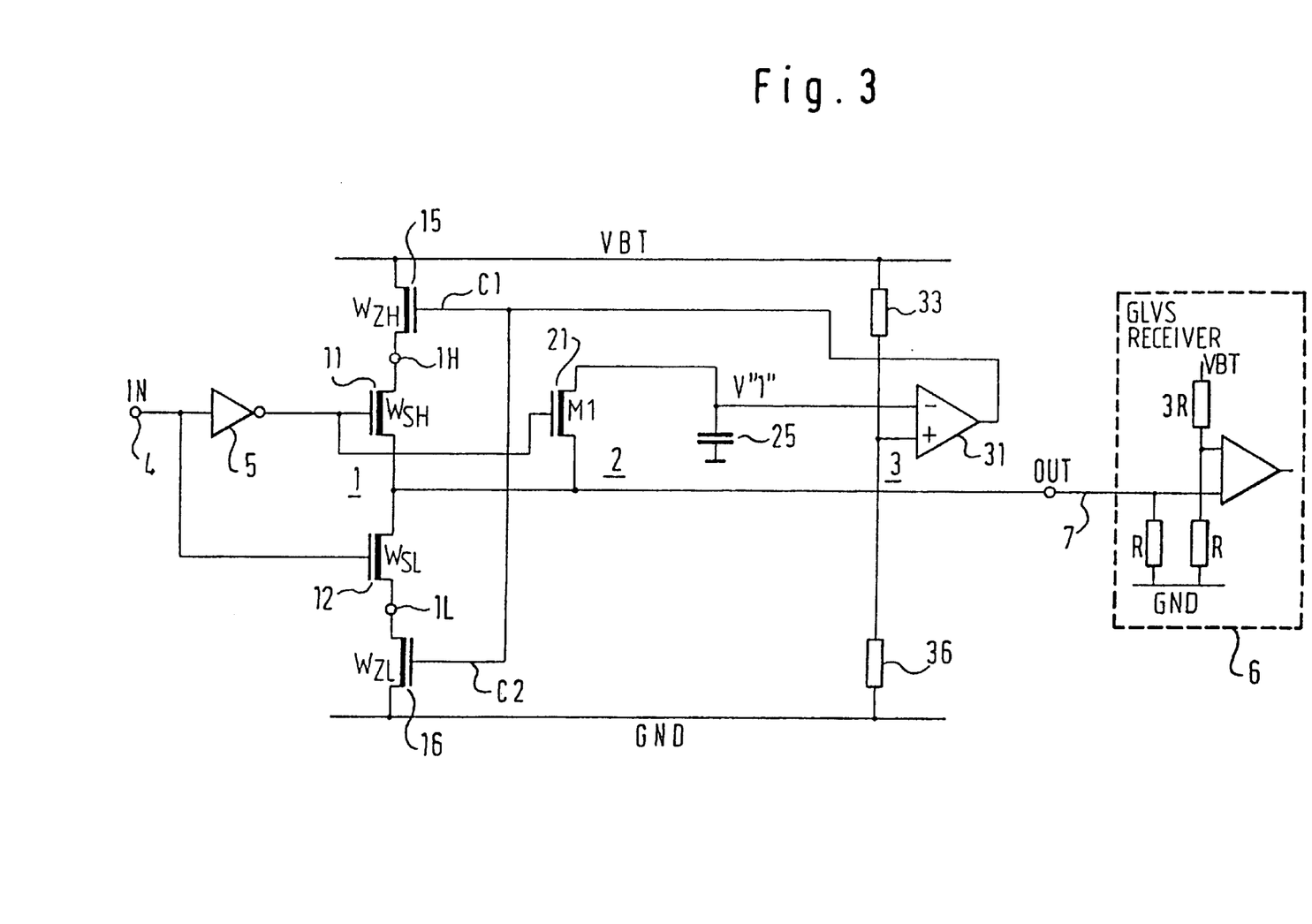
FIG. 3 shows a third embodiment for driving an asymmetrical transmission line including single loop output impedance control.

FIG. 3 shows a third embodiment of an output buffer circuit according to the present invention, this buffer circuit being adapted to drive an asymmetric transmission line 7, e.g. a coaxial transmission line having a first conductor connected to output terminal OUT and a second conductor e.g. connected to ground.

The circuit shown in FIG. 3 comprises a switch stage 1 constituted by an upper switching transistor 11 and a lower switching transistor 12 connected in series. Switching transistor 12 receives at its gate a data input signal IN applied to an input terminal 4 while switching transistor 11 receives at its gate a complementary data input signal output by inverter circuit 5 for inverting the data input signal IN. Switching transistors 11 and 12 together with inverter 5 act as a push pull stage in accordance with the data input signal IN.

Reference numeral 15 denotes a MOSFET transistor acting as an upper adjustable impedance element connected between an upper supply line VBT for supplying an upper power supply potential, and input port terminal 1H of the switching stage 1. Similarly, reference numeral 16 denotes a MOSFET transistor acting as a lower adjustable impedance element, connected between a lower supply line GND for supplying a lower power supply potential, and input port terminal 1L of the switch stage 1. Upper transistor 15 receives at its gate a first impedance control signal C1 while lower transistor 16 receives at its gate a second impedance control signal C2.

Reference numeral 2 denotes a selector circuit which in this embodiment comprises a switching transistor 21 and a capacitor 25. Switching transistor 21 is arranged to connect the capacitor 25 in a switching manner synchronized with the data input signal IN, with the output port OUT of the switch stage 1. The other terminal of capacitor 25 is connected with the lower supply line GND.

Reference numeral 3 denotes an impedance control circuit comprising a control amplifier 31 and reference resistors 33, 36. The noninverting input of control amplifier 31 receives a reference voltage from a voltage divider constituted by resistors 33 and 36. The inverting input of control amplifier 31 is connected with capacitor 25 and receives the voltage across capacitor 25. The output of control amplifier 31 is connected with the gate of transistor 15 and with the gate of transistor 16 and supplies the control signals C1 and C2.

Similar to the first embodiment described with reference to FIG. 1, the lower transistor 16 can have but need not have a smaller channel width $W_{ZL}$ than the upper transistor 15 such that the impedance of the upper impedance means 15 and the lower impedance means 16, both receiving the same control signal, are approximately equal.

In operation, switching transistor 21 of selector circuit 2 turns conducting always if upper switching transistor 11 of switch stage 1 is conducting. Accordingly, capacitor 25 is connected to the output port OUT always if the output port is driven high whereas capacitor 25 is disconnected from the output port OUT when the output port OUT is driven low. During the latter period, capacitor 25 holds the output voltage of the output port OUT during the high period and thus provides an impedance detection signal to impedance control circuit 3.

Impedance control circuit 3 operates to adjust the impedance of transistor 15 in series with the ON impedance of transistor 11 such that this series impedance together with the load impedance connected to output port OUT and constituted by transmission line 7 terminated by a receiver 6, provides a voltage divider with the same divider ratio as the divider ratio of resistors 33 and 36. If resistors 33 and 36 are chosen to have equal resistance, the series impedance of the upper impedance element 15 and the ON impedance of switching transistor 11 will be equal to the load impedance connected to output port OUT.

The channel width $W_{SH}$ of the upper switching transistor 11 and the channel width $W_{SL}$ of the lower switching transistor 12 of the switch stage 1 is chosen such that the ON resistance of transistor 11 is approximately equal to the ON resistance of transistor 12. Accordingly, the series impedance of the lower impedance element 16 and the lower switching transistor 12 will be approximately equal to the series impedance of the upper impedance element 15 and the upper switching transistor 11, this resulting in the output impedance of the buffer circuit at its output port OUT being self-adjustable to the load impedance at the output port OUT.

Figure 4:
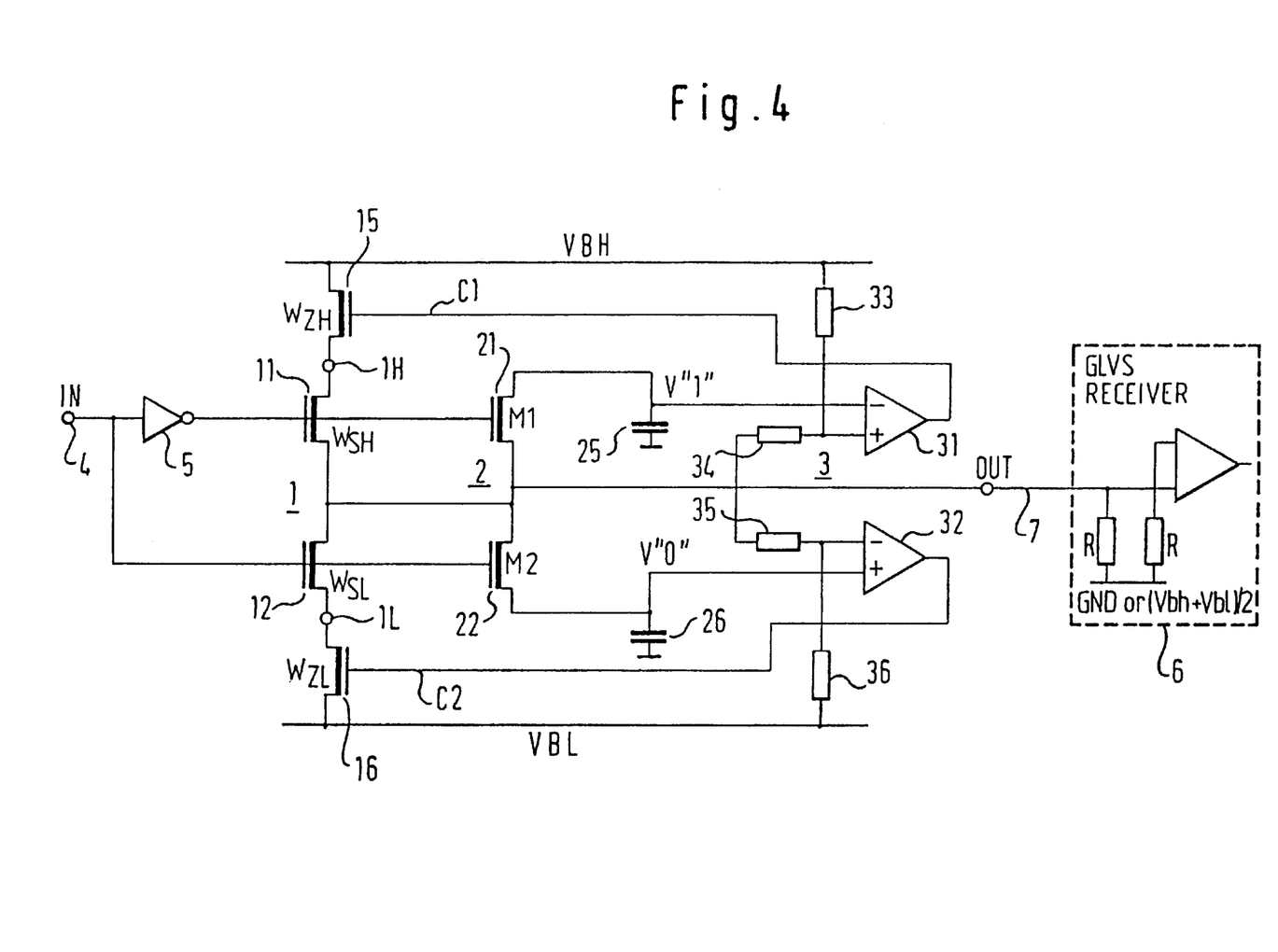
FIG. 4 shows a fourth embodiment for driving an asymmetrical transmission line including dual loop output impedance control.

FIG. 4 shows a fourth embodiment of an output buffer circuit according to the present invention. Similar to the previously described embodiment, also this embodiment is particularly suitable for driving an asymmetric transmission line 7, e.g. a coaxial transmission line.

The buffer circuit according to FIG. 4 includes a switch stage 1 driven by a data input signal IN applied to input terminal 4, and by the inverted input signal output by inverter 5, in the same manner as described with reference to FIG. 3. Similar to the previous embodiment, the circuit furthermore comprises an upper MOSFET transistor 15 connected between an upper power supply line VBH for supplying an upper power supply potential, and node 1H of the input port of switch stage 1. The circuit also includes a lower MOSFET transistor 16 acting as a lower adjustable impedance element and connected between a lower power supply line VBL for supplying a lower power supply potential, and node 1L of the input port of switching stage 1. In this embodiment the gates of transistors 15 and 16 receive individual impedance control signals C1 and C2, respectively. The channel width $W_{ZL}$ of the lower transistor 16 can be but need not be smaller than the channel width $W_{ZH}$ of the upper impedance transistor 15.

Reference numeral 2 denotes a selector circuit comprising a first switching transistor 21 and a second transistor 22 and furthermore comprising a first capacitor 25 and a second capacitor 26. Switching transistor 21 is arranged such that it can connect the output port OUT of the switch stage 1 with capacitor 25 in accordance with a control signal applied to the gate of transistor 21 and received from the output of inverter circuit 5. Switching transistor 22 is arranged such that it can connect the output port OUT with capacitor 26 in accordance with a control signal applied to the gate of transistor 22 and received from the data input terminal 4. The terminals of capacitors 25 and 26 not connected with transistor 21 or 22, can be connected with the lower supply line VBL or with a potential GND symmetrically centered between VBH and VBL.

Similar to the embodiment described with reference to FIG. 2, the fourth embodiment comprises an upper control amplifier 31 and a lower control amplifier 32. An inverting input of control amplifier 31 receives the voltage across capacitor 25 as a first impedance detection signal. The noninverting input of the lower control amplifier 32 receives the voltage across capacitor 26 as a second impedance detection signal. Reference numerals 33 to 36 denote reference resistors for providing reference voltages to the noninverting input of control amplifier 31 and the inverting input of control amplifier 32 in the same manner as described with reference to FIG. 2. The output of control amplifier 31 provides the control signal C1 for adjusting the impedance of the upper transistor 15 while the second control amplifier 32 outputs control signal C2 for adjusting the impedance of the lower impedance means 16.

In operation, switching transistor 21 of selector circuit 2 turns conducting always if upper switching transistor 11 of switch stage 1 is conducting. Conversely, switching transistor 22 of selector circuit 2 turns conducting always if lower switching transistor 12 of switch stage 1 is conducting. Thus, capacitor 25 is connected to the output port OUT always if the output port is driven high but not when the output port OUT is driven low whereas capacitor 26 is connected to the output port OUT always if the output port is driven low but not if the output port is driven high. While not being connected to the output port OUT, capacitor 25 and 26, respectively, holds the high voltage and the low voltage, respectively, at output terminal OUT.

Control amplifier 31 will operate to adjust the series impedance of impedance element 15 and the ON impedance of transistor 11 such that the ratio of this series impedance to the load impedance connected between output terminal OUT and ground is equal to the ratio of resistor 33 and 34. Similarly, control amplifier 32 will operate to adjust the series impedance of impedance element 16 and the ON impedance of transistor 12 such that the ratio of this series impedance to the load impedance equals the ratio of resistor 36 to resistor 35. Accordingly, if each of the resistors 32 to 36 has the same resistance R, the output impedance at output port OUT will adjust itself to match the impedance of the load connected between output port OUT and ground GND.

What is claimed is:

1. Output buffer circuit for driving a transmission line (7) in accordance with data to be transmitted, the circuit comprising:
   a switch stage (1) having an input port (1H, 1L), a control terminal (4) for receiving a digital input signal (IN) in accordance with data to be transmitted, and an output port for connection to said transmission line (7);
   said switch stage (1) comprising switches (11 to 14) adapted for connecting said output port (OP, ON) with said input port (1H, 1L) in accordance with said digital input signal (IN);
   impedance means (15, 16) connected to said switch stage (1) and having an impedance control input (C1, C2), an impedance of said impedance means (15, 16) being adjustable in accordance with a control signal applied to said impedance control input (C1, C2);
   means (3) for controlling an output impedance of the output port of the switch stage (1) by adjusting of the impedance of said impedance means (15, 16) in accordance with a deviation of a detected output impedance from a desired impedance value;
   a selector circuit (2) for selectively connecting said output port (OP, ON) of said switch stage (1) with a detection input of said means for controlling (3); and
   said selector circuit (2) being connected to receive a selection control signal having a fixed timing relationship with said digital input signal (IN).

2. An output buffer circuit according to claim 1, characterized in that
   said selector circuit (2) is adapted to select between two different modes of connecting said output port of said switch stage (1) to said detection input in accordance with two binary states of said selection control signal.

3. An output buffer circuit according to claim 1, characterized in that
   said switch stage (1) comprises a quadruple of switch elements (11 to 14) connected as a bridge, a first diagonal (1H, 1L) of said bridge constituting said input port, a second diagonal (OP, ON) of said bridge constituting said output port; and
   said impedance means (15) comprises
      an upper impedance means (15) connected between said input port (1H) and a power supply line (VBH, VBT) for supplying an upper supply potential; and
      a lower impedance means (16) connected between said input port (1L) and a power supply line (VBL, GND) for supplying a lower supply potential.

4. An output buffer according to claim 3, characterized in that
   said selector circuit (2) is adapted to select that output terminal of said output port (OP, ON) which has a predetermined logic level, for connection with said detection input of said control means (3).

5. An output buffer according to claim 4, characterized in that
   said selector circuit (2) comprises a pair of switch elements (21, 22), each switch element being connected between one of the output terminals of said output port (OP, ON) of the switch stage (1) and said detection input of said control means (3);
   said switch elements (21, 22) of the pair being connected to receive complementary switching control signals in accordance with the logical state of said digital input signal (IN).

6. An output buffer circuit according to claim 3, characterized in that
   said selector circuit (2) is adapted to select that output terminal of said output port (OP, ON) which has a first predetermined logic level, for connection with a first detection input of said control means (3), and to select that output terminal of said output port (OP, ON) which has a logic level complementary to said first logic level, for connection with a second detection input of said control means (3).

7. An output buffer circuit according to claim 6, characterized in that
   said selector circuit (2) comprises a quadruple of switch elements (21 to 24) connected as a selector bridge;
   a first diagonal (22, 23) of selector switch elements being connected to receive a control signal in accordance with said digital control signal (IN);
   a second diagonal (21, 24) of selector switch elements being connected to receive a control signal in complementary relation to said digital control signal (IN).

8. An output buffer circuit according to claim 1, characterized in that
   said switch stage (1) comprises a series connection of an upper switch element (11) and a lower switch element (12), connected across the input port (1H, 1L), the output port (OUT) comprising a connection node between the upper and the lower switch element; and
   said impedance means comprises
      an upper impedance means (15) connected between said input port (1H) and a power supply line (VBH, VBT) for supplying an upper supply potential; and
      a lower impedance means (16) connected between said input port (1L) and a power supply line (VBL, GND) for supplying a lower supply potential.

9. An output buffer circuit according to claim 8, characterized in that
   said selector circuit (2) is adapted to connect the output port (OUT) of said switch stage (1) with said detection input of said controlling means (3) and to disconnect the output port (OUT) of said switch stage (1) from said detection input, depending on the logical level of said digital input signal (IN).

10. An output buffer circuit according to claim 9, characterized in that
    said selector circuit (2) comprises a switch element (21) connected between an output terminal of said output port (OUT) and said detection input of said control means (3);

said switch element (21) being connected to receive a switching control signal depending on said digital input signal (IN).

11. An output buffer circuit according to claim 9, characterized by means (25, 26) for holding a signal at said detection input of said impedance control means (3) during a period of time when said selector circuit (2) disconnects said output port from said detection input.

12. An output buffer circuit according to claim 5, characterized in that said means for controlling (3) comprises a control amplifier (31, 32) connected to receive at its inverting input a reference voltages its non inverting input being connected to receive a detection input signal output by said selector circuit (2);

the output of said control amplifier (31, 32) being connected to control an impedance value of said upper and said lower impedance elements.

13. An output buffer circuit according to claim 12, characterized in that said upper impedance element (15) comprises a first MOSFET having a first channel width $W_{ZH}$;

said lower impedance element (16) comprises a second MOSFET having a channel width ($W_{ZL}$) smaller than said first MOSFET;

said output of said control amplifier (31) being connected to a gate of said first MOSFET and a gate of said second MOSFET.

14. An output buffer circuit according to claim 8, characterized in that said selector circuit (2) is adapted to connect the output port of said switch stage with a first detection input of said controlling means and to disconnect the output port of said switch stage from a second detection input of said impedance controlling means and vice versa, depending on the logical level of said digital input signal.

15. An output buffer circuit according to claim 14, characterized in that said selector circuit (2) comprises a first switch element (21) connected between an output terminal (OUT) of said output port and said first detection input of said control means (3) and a second switch element (22) connected between said output terminal (OUT) of said output port and said second detection input of said control means (3);

said first and second switch elements (21, 22) being connected to receive switching control signals in complementary relation to each other and depending on said digital input signal (IN).

16. An output buffer circuit according to claim 7, characterized in that said control means (3) comprises a first control amplifier (31) connected to receive at its inverting input a first reference voltage, its non inverting input being connected to receive a first detection input signal output by said selector circuit (2);

the output of said first control amplifier (31) being connected to control an impedance value of said upper impedance element (15); and a second control amplifier (32) connected to receive at its inverting input a second reference voltage, its non inverting input being connected to receive a second detection input signal output by said selector circuit (2);

the output of said second control amplifier being connected to control an impedance value of said lower impedance element (16).

17. An output buffer circuit according to claim 16, characterized in that said upper impedance element (15) and said lower impedance element (16), respectively, comprises a MOSFET connected to receive at its gate an output signal of said first (31) and second (32) control amplifier, respectively.

18. An output buffer circuit for driving a transmission line in accordance with data to be transmitted, the output buffer circuit comprising:

a switch stage having an input port, a control terminal for receiving a digital input signal in accordance with data to be transmitted, and an output port for connection to said transmission line;

said switch stage including at least one switch for connecting said output port with said input port in accordance with said digital input signal;

at least one transistor connected to said switch stage and having an impedance control input, an impedance of said at least one transistor being adjustable in accordance with a control signal applied to said impedance control input;

a controller for controlling an output impedance of the output port of the switch stage by adjusting of the impedance of said at least one transistor in accordance with a deviation of a detected output impedance from a desired impedance value;

a selector circuit for selectively connecting said output port of said switch stage with a detection input of said controller; and said selector circuit being connected to receive a selection control signal having a fixed timing relationship with said digital input signal.

19. An output buffer circuit according to claim 18, wherein said selector circuit selects between two different modes of connecting said output port of said switch stage to said detection input in accordance with two binary states of said selection control signal.

* * * * *